US012612688B2

(12) United States Patent
Liu

(10) Patent No.: US 12,612,688 B2
(45) Date of Patent: Apr. 28, 2026

(54) MASK, MASK ASSEMBLY, AND METHOD FOR MANUFACTURING MASK ASSEMBLY

(71) Applicant: BOE Technology Group Co., Ltd., Beijing (CN)

(72) Inventor: Yue Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 853 days.

(21) Appl. No.: 17/788,980

(22) PCT Filed: Aug. 4, 2021

(86) PCT No.: PCT/CN2021/110585
§ 371 (c)(1),
(2) Date: Jun. 24, 2022

(87) PCT Pub. No.: WO2022/068379
PCT Pub. Date: Apr. 7, 2022

(65) Prior Publication Data
US 2023/0031990 A1 Feb. 2, 2023

(30) Foreign Application Priority Data

Sep. 29, 2020 (CN) .......................... 202011054111.2

(51) Int. Cl.
*C23C 14/04* (2006.01)
*H10K 71/00* (2023.01)
*H10K 71/16* (2023.01)
(52) U.S. Cl.
CPC .......... *C23C 14/042* (2013.01); *H10K 71/00* (2023.02); *H10K 71/166* (2023.02)

(58) Field of Classification Search
USPC ......................................... 118/504, 505, 721
See application file for complete search history.

(56) References Cited

U.S. PATENT DOCUMENTS

| | | | | |
|---|---|---|---|---|
| 2018/0312979 A1* | 11/2018 | Shinno | .................. | C23C 14/042 |
| 2021/0207257 A1* | 7/2021 | Jin | ........................ | C23C 14/24 |
| 2021/0324530 A1 | 10/2021 | Liu et al. | | |
| 2021/0351351 A1* | 11/2021 | Zhao | .................... | H10K 71/166 |

FOREIGN PATENT DOCUMENTS

| | | | | | |
|---|---|---|---|---|---|
| CN | 103180972 A | * | 6/2013 | .......... | H01L 33/007 |
| CN | 104425219 A | * | 3/2015 | .......... | B05C 21/005 |
| CN | 108559947 A | | 9/2018 | | |

(Continued)

OTHER PUBLICATIONS

English Translation CN-103180972A (Year: 2013).*

(Continued)

*Primary Examiner* — Yewebdar T Tadesse
(74) *Attorney, Agent, or Firm* — WHDA, LLP

(57) ABSTRACT

Provided are a mask, a mask assembly, and a method for manufacturing a mask assembly, the mask including: an effective mask region located in a middle portion of the mask, wherein the effective mask region includes a plurality of first through holes arranged in an array; and a welding region configured to be welded to a mask frame and located on opposite sides of the effective mask region, wherein the welding region includes a plurality of second through holes arranged in an array.

17 Claims, 9 Drawing Sheets

(56)         References Cited

FOREIGN PATENT DOCUMENTS

| CN | 108642441 | A |   | 10/2018 |
| CN | 111455314 | A |   | 7/2020 |
| CN | 112126893 | A |   | 12/2020 |
| CN | 112281113 | A |   | 1/2021 |
| JP | 2014-148744 | A |   | 8/2014 |
| JP | 2014-218749 | A |   | 11/2014 |
| KR | 20190142460 | A | * | 12/2019 |

OTHER PUBLICATIONS

English Translation CN-104425219A (Year: 2015).*
English Translation KR20190142460A (Year: 2019).*
Office Action dated Nov. 19, 2021, issued in counterpart CN application No. 202011054111.2, with English translation. (22 pages).

* cited by examiner

100

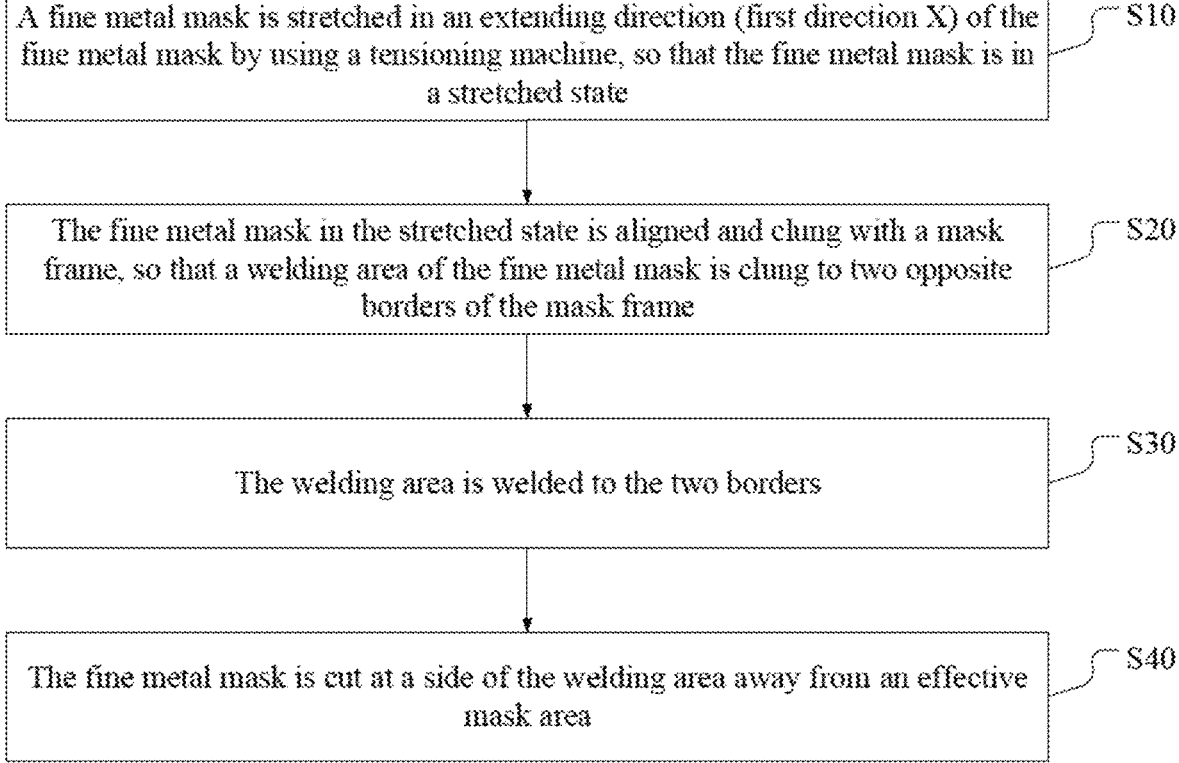

A fine metal mask is stretched in an extending direction (first direction X) of the fine metal mask by using a tensioning machine, so that the fine metal mask is in a stretched state                    S10

The fine metal mask in the stretched state is aligned and clung with a mask frame, so that a welding area of the fine metal mask is clung to two opposite borders of the mask frame                    S20

The welding area is welded to the two borders                    S30

The fine metal mask is cut at a side of the welding area away from an effective mask area                    S40

MASK, MASK ASSEMBLY, AND METHOD FOR MANUFACTURING MASK ASSEMBLY

CROSS REFERENCE TO RELATED APPLICATION

This application is a Section 371 National Stage Application of International Application No. PCT/CN2021/110585, filed on Aug. 4, 2021, entitled "MASK, MASK ASSEMBLY, AND METHOD FOR MANUFACTURING MASK ASSEMBLY", which is incorporated herein by reference in its entirety which claims priority to Chinese Application No. 202011054111.2, filed on Sep. 29, 2020, incorporated herein by reference in their entirety.

TECHNICAL FIELD

The present disclosure relates to a field of photolithography masking technology, and in particular, to a mask, a mask assembly and a method for manufacturing a mask assembly.

BACKGROUND

In OLED (Organic Light Emitting Display) manufacturing technology, a mask used for vacuum evaporation is a crucial component, and a quality of the mask directly affects a production cost and a product quality. Among masks used in OLED evaporation process, a fine metal mask (FMM) is one of the most critical devices. The FMM is used to evaporate a light-emitting layer material to form a pixel pattern on a backplane.

SUMMARY

Some embodiments of the present disclosure provide a mask including: an effective mask region located in a middle portion of the mask, wherein the effective mask region includes a plurality of first through holes arranged in an array; and a welding region configured to be welded to a mask frame and located on opposite sides of the effective mask region, wherein the welding region has a plurality of second through holes arranged in an array.

In some embodiments, the mask further includes: a stress buffering region located on a side of the welding region away from the effective mask region, wherein the stress buffering region includes a plurality of third through holes arranged in an array, and the stress buffering region is configured to buffer a stress on the mask when the mask is tensioned.

In some embodiments, the mask further includes: a clamping region configured to be clamped by a clamp of a tensioning machine when the mask is tensioned, and located on a side of the stress buffering region away from the welding region.

In some embodiments, the welding region includes a first welding region and a second welding region, and the first welding region and the second welding region are respectively located on opposite sides of the effective mask region; the stress buffering region includes a first stress buffering region and a second stress buffering region, the first stress buffering region is located on a side of the first welding region away from the effective mask region, and the second stress buffering region is located on a side of the second welding region away from the effective mask region; the clamping region includes a first clamping region and a second clamping region, the first clamping region is located on a side of the first stress buffering region away from the first welding region, and the second clamping region is located on a side of the second stress buffering region away from the second welding region.

In some embodiments, a distribution density of the first through holes, a distribution density of the second through holes, and a distribution density of the third through holes are the same or different.

In some embodiments, a material of the mask is a metal or metal alloy material with a low coefficient of expansion.

In some embodiments, the material of the mask is Invar alloy or SUS alloy.

In some embodiments, a shape of the first through hole is a circle or a polygon.

In some embodiments, a spacing between adjacent first through holes is 10 to 300 μm.

Some embodiments of the present disclosure provide a mask assembly including: a mask frame including a plurality of borders and an open region surrounded by the plurality of borders; and at least one mask according to embodiments described above, wherein a welding region of the mask is welded to two opposite borders of the mask frame.

In some embodiments, an orthographic projection of an effective mask region of the mask on the mask frame falls into the open region.

In some embodiments, the at least one mask includes a plurality of masks, and the plurality of masks are sequentially arranged in an extending direction of the two opposite borders.

In some embodiments, a material of the mask frame is a metal or metal alloy material with a low coefficient of expansion.

Some embodiments of the present disclosure provide a method for manufacturing a mask assembly, the method including: stretching the mask according to embodiments described above in an extending direction of the mask by using a tensioning machine, so that the mask is in a stretched state; aligning and clinging the mask in the stretched state with the mask frame, so that a welding region of the mask is clung to two opposite borders of the mask frame; and welding the welding region to the two borders.

In some embodiments, the welding the welding region to the two borders includes: arranging a welding sheet at the welding region, wherein the welding sheet is located on a side of the welding region away from the mask frame, and the welding region is welded to the two borders by using the welding sheet.

In some embodiments, the method further includes: cutting the mask on a side of the welding region away from the effective mask region.

BRIEF DESCRIPTION OF DRAWINGS

Other features, objects and advantages of the present disclosure will become more apparent upon reading the detailed description of non-limiting embodiments with reference to the following accompanying drawings.

FIG. 4 shows a flowchart of a method for manufacturing a mask assembly according to some embodiments of the present disclosure.

DETAILED DESCRIPTION

Figure 1:
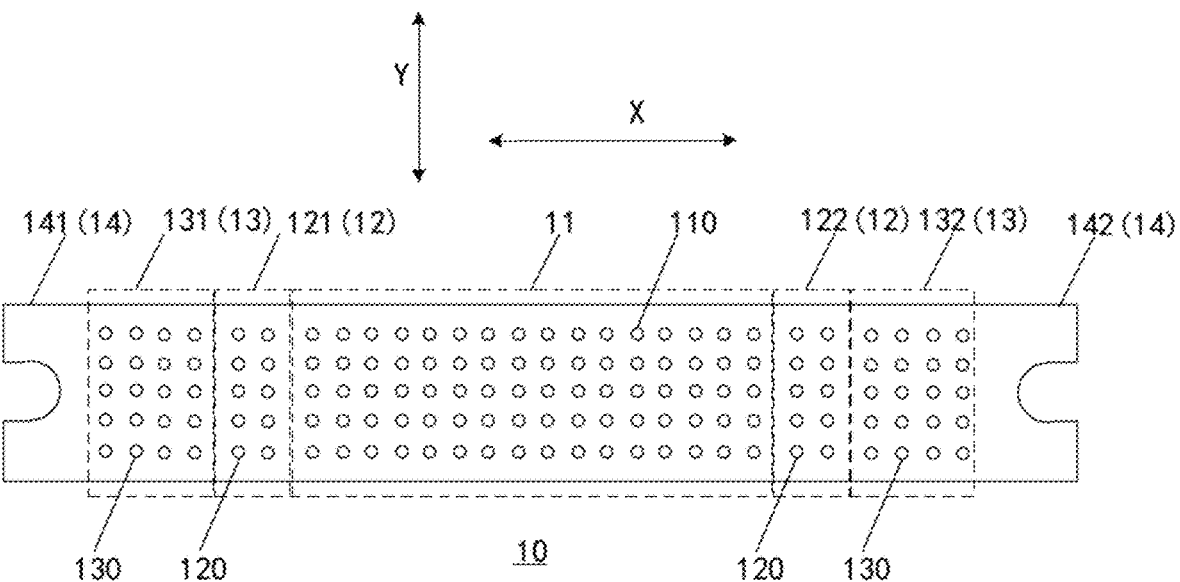
FIG. 1 shows a schematic structural diagram of a fine metal mask according to some embodiments of the present disclosure.

The present disclosure will be further described in detail below with reference to the accompanying drawings and embodiments. It should be understood that specific embodiments described herein are only used to explain the related invention, but not to limit the invention. In addition, it should be noted that, for the convenience of description, only parts related to the invention are shown in the accompanying drawings.

It should be noted the embodiments of the present disclosure and the features of the embodiments may be combined with each other under a condition of no conflict.

Furthermore, in the following detailed description, for convenience of explanation, numerous specific details are set forth in order to provide a thorough understanding of the embodiments of the present disclosure. Obviously, however, one or more embodiments may be implemented without these specific details.

It should be understood that, although the terms first, second, etc. may be used herein to describe various elements, these elements should not be limited by these terms. These terms are only used to distinguish one element from another. For example, without departing from the scope of example embodiments, a first element could be termed a second element, and, similarly, a second element could be termed a first element. As used herein, a term "and/or" includes any and all combinations of one or more of related listed items.

It should be understood that when an element or layer is described as being "formed on" another element or layer, the element or layer may be directly or indirectly formed on the another element or layer. That is, for example, an intervening element or interlayer may be present. In contrast, when an element or layer is described as being "formed directly on" another element or layer, there is no intervening element or layer. Other terms used to describe a relationship between elements or layers should be interpreted in a similar manner (e.g., "between . . . and" versus "directly between . . . and", "adjacent" versus "directly adjacent", etc.).

The terms used herein is for the purpose of describing particular embodiments only and is not intended to limit the embodiments. As used herein, singular forms are also intended to include plural forms unless a context clearly dictates otherwise. It will also be understood that terms "comprising" and/or "including", when used herein, specify a presence of the feature, whole, step, operation, element and/or component, but do not preclude a presence or addition of one or more other features, whole, step, operation, element, component and/or a combination thereof.

In the present disclosure, unless otherwise specified, expressions "located on a same layer" and "disposed on a same layer" generally mean that a first part and a second part may use a same material and may be formed by a same patterning process. Expressions "located on different layers", "disposed on different layers" generally mean that a first part and a second part are formed by different patterning processes.

At present, a mainstream method for mass production of AMOLED (Active Matrix Organic Light Emitting Display) panels is vacuum evaporation, which must use FMM evaporation technology. The full name of FMM is fine metal mask, which is a core component in the evaporation process. Mainly functions of FMM is to deposit RGB organic light emitting materials to a corresponding position of a substrate during the AMOLED production process and form a pattern on the substrate. Since a thickness of the FMM is very thin, wrinkles are easily generated during a tensioning process, and its flatness directly affects an evaporation effect. The larger the panel size is, the higher the resolution is, the larger and finer the required FMM size is, and the requirement on the flatness of the FMM is higher.

In the present disclosure, unless otherwise specified, a mask refers to a fine metal mask, i.e., FMM.

The present disclosure provides a mask, the mask including: an effective mask region located in a middle portion of the mask, wherein the effective mask region includes a plurality of first through holes arranged in an array; and a welding region configured to be welded to a mask frame and located on opposite sides of the effective mask region, wherein the welding region includes a plurality of second through holes arranged in an array. In the present disclosure, by arranging the through holes in the welding region of the fine metal mask, a stretching wrinkle of the fine metal mask may be reduced, and a tensioning flatness of the fine metal mask may be improved. The mask assembly using the fine metal mask may obtain a better evaporation effect in the AMOLED manufacturing process.

Some embodiments of the present disclosure provide a fine metal mask. FIG. 1 shows a schematic structural diagram of a fine metal mask according to some embodiments of the present disclosure. As shown in FIG. 1, a fine metal mask 10 includes: an effective mask region 11 located in a middle portion of the fine metal mask; a welding region 12 located on opposite sides of the effective mask region 11; a stress buffering region 13 located on a side of the welding region 12 away from the effective mask region 11; and a clamping region 14 located on a side of the stress buffering region 13 away from the welding region 12.

Specifically, the effective mask region 11 includes a plurality of first through holes 110 arranged in an array. In the AMOLED evaporation process, the effective mask region 11 corresponds to a pixel display region of the AMOLED. For example, a light-emitting layer of each pixel of the AMOLED is evaporated using the first through holes 110 of the effective mask region 11.

The welding region 12 is configured to be welded to a mask frame, that is, after the fine metal mask 10 is tensioned by a tensioning machine, the welding region 12 is welded to the mask frame, thereby forming a mask assembly. The welding region 12 includes a first welding region 121 and a second welding region 122, and the first welding region 121 and the second welding region 122 are respectively located on opposite sides of the effective mask region 11. For example, as shown in FIG. 1, in a first direction X, the first welding region 121 and the second welding region 122 are respectively located on opposite sides of the effective mask region 11. The welding region 12 includes second through holes 120 arranged in an array.

The stress buffering region 13 is configured to buffer a stress on the fine metal mask 10 when the fine metal mask 10 is tensioned by the tensioning machine. The stress buffering region 13 includes a first stress buffering region 131 and a second stress buffering region 132. The first stress buffering region 131 is located on a side of the first welding region 121 away from the effective mask region 11, and the second stress buffering region 132 is located on a side of the second welding region 122 away from the effective mask region 11. The stress buffer region 13 includes third through holes 130 arranged in an array.

The clamping region 14 is configured to be clamped by an included angle of the tensioning machine when the fine metal mask 10 is tensioned, and is used to stretch the fine metal mask 10 and apply a pretension force to the fine metal mask 10. The clamping region 14 includes a first clamping region 141 and a second clamping region 142. The first clamping region 141 and the second clamping region 142 are located on opposite ends of the fine metal mask 10, respectively. The first clamping region 141 is located on a side of the first stress buffering region 131 away from the first welding region 121, and the second clamping region 142 is located on a side of the second stress buffering region 132 away from the second welding region 122.

Although the first clamping region 141 and the second clamping region 142 shown in FIG. 1 only have one notch, those skilled in the art will understand that FIG. 1 is only a schematic diagram, and each of the first clamping region 141 and the second clamping region 141 may have a plurality of notches to facilitate the clamping of the tensioning machine.

In some embodiments, as shown in FIG. 1, the fine metal mask 10 is in a shape of a long strip extending in the first direction X as a whole. The fine metal mask 10 is, for example, a wide fine metal mask, and its width in a second direction Y may be 200 to 300 mm, for example, 238 mm.

In some embodiments, as shown in FIG. 1, the fine metal mask 10 is substantially an axisymmetric pattern, the first welding region 121 and the second welding region 122 are substantially symmetrically arranged with respect to a center of the effective mask region 11 in the second direction Y, the first stress buffering region 131 and the second stress buffering region 132 are substantially symmetrically arranged with respect to a centerline of the effective mask region 11 in the second direction Y, and the first clamping region 141 and the second clamping region 142 are substantially symmetrically arranged with respect to the centerline of the effective mask region 11 in the second direction Y.

In these embodiments, the effective mask region 11, the welding region 12 and the stress buffering region 13 all have through holes. Compared with a solution in the related art that the through holes are only formed in the effective mask region and the stress buffering region 13 but not in the welding region, the stretching wrinkle of the fine metal mask during the tensioning process may be reduced, and the tensioning flatness of the fine metal mask may be improved, thereby reducing defects in the evaporation process and improving a production yield.

In some embodiments, a shape, a size and a distribution density of the first through holes 110 in the effective mask region 11 are determined by a pixel structure and distribution of AMOLED to be produced. The shape of the first through hole 110 in the effective mask region 11 may be a circle or a polygon, for example, the shape of the first through hole 110 in the effective mask region 11 is a square, a hexagon, or the like. In some embodiments, the size of the first through hole 110 in the effective mask region 11 is, for example, 20 to 300 μm. For example, when the shape of the first through hole 110 is circular, a diameter of the first through hole 110 may be 20 to 300 μm, e.g., 150 μm or 200 μm. For example, when the shape of the first through hole 110 is a square, a side length of the first through hole 110 may be 20 to 300 μm, e.g., 150 μm or 200 μm. In some embodiments, a spacing between two adjacent first through holes may be 20 to 300 μm, for example, in the first direction X or the second direction Y, the spacing between two adjacent first through holes may be 20 to 300 μm, e.g., 50 μm or 80 μm.

In some embodiments, a shape, a size and/or a distribution density of the second through holes 120 in the welding region 12 and the third through holes 130 in the stress buffering region 13 may be the same as or different from the first through holes 110 in the effective mask region 11. Specific conditions may be designed according to actual needs.

In some embodiments, a shape, a size and a spacing of the third through holes 130 in the stress buffering region 13 may be consistent with the first through holes 110 in the effective mask region 11, which may reduce a difficulty in manufacturing the fine metal mask 10. However, for projects with different design requirements, a design of the third through holes 130 of the stress buffering region 13 may also be adjusted, and a main purpose of the design is only to uniform a stress of the fine metal mask 10 during stretching, and reduce a formation of wrinkles of effective mask region 11.

In some embodiments, in order to ensure uniform a stress distribution in the effective mask region 11 when the fine metal mask 10 is stretched, the shape, the size and the spacing of the second through holes 120 in the welding region 12 may be consistent with the first through holes 110 in the effective mask region 11. In order to improve the strength of the welding region 12 in actual practice, a distribution density of the second through holes 120 in the welding region 12 may also be appropriately adjusted, for example, the distribution density of the second through holes 120 may be smaller than the distribution density of the first through holes in the effective mask region 11.

In some embodiments, the fine metal mask 10 is made of metal or metal alloy with a low coefficient of expansion. For example, a material of the fine metal mask 10 may be Invar alloy or SUS alloy. The fine metal mask 10 supported by these materials has a low coefficient of expansion, and may still maintain an original appearance under a high temperature state of the evaporation process, which is beneficial to a fine evaporation of the light emitting layer of the AMOLED.

In some embodiments, although FIG. 1 shows a demarcation of the welding region and the stress buffering region, it is only for the convenience of illustration. The welding region and the stress buffering region are functionally defined, and there may be no clear boundary between the welding region and the stress buffering region, or even that the welding region may be understood as a part of the stress buffering region close to the effective mask region.

Figure 2:
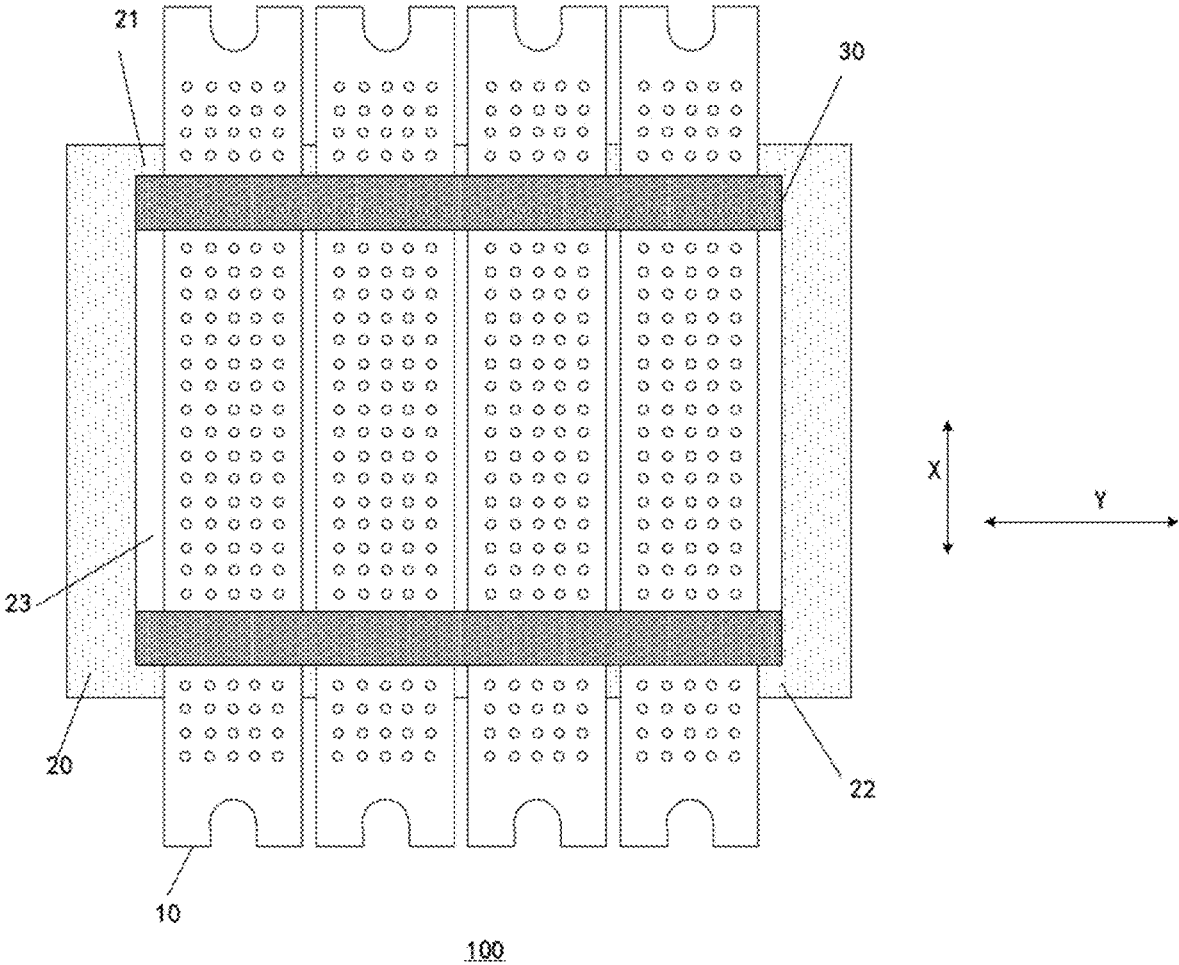
FIG. 2 shows a schematic structural diagram of a mask assembly according to some embodiments of the present disclosure.

Some embodiments of the present disclosure provide a mask assembly. FIG. 2 shows a schematic structural diagram of a mask assembly according to some embodiments of the present disclosure. As shown in FIG. 2, the mask assembly 10 includes: a mask frame 20 and the fine metal mask 10 according to the embodiments described above, the mask frame 20 including a plurality of borders and an open region 23 surrounded by the plurality of borders. As shown in FIG. 2, the mask frame 20 is a rectangular frame, and includes two borders opposite to each other in the first direction X, that is, a first border 21 and a second border 22. After the fine metal mask 10 is tensioned by the tensioning machine, the welding region 12 of the fine metal mask 10 is welded to the border of the mask frame 20 by a welding process, so that the fine metal mask 10 welded on the mask frame 20 is kept to be in a tensioned state, which may reduce bending caused by gravity as much as possible, and guarantee the tensioning flatness of the metal mask 10.

Specifically, the welding region 12 of the tensioned fine metal mask 10 may be welded to the mask frame 20 by a laser welding process. Since the welding region 12 includes the second through holes 120, in the tensioning process of the fine metal mask 10, in order to ensure that the fine metal mask may be fixed on the mask frame 20, a welding sheet 30 needs to be arranged on the fine metal mask, and the welding sheet 30 is a solid material sheet. The border of the mask frame 20, the welding region 12 of the fine metal mask 10 and the welding sheet 30 are sequentially stacked and then welded together by laser welding and other processes. For example, the first border 21 of the mask frame 20, the first welding region 121 of the fine metal mask 10, and an upper welding sheet 30 are welded together by the laser welding process, and the second border 22 of the mask frame 20, the second welding region 122 of the fine metal mask 10 and a lower welding sheet 30 are welded together by the laser welding process.

In some embodiments, a plurality of fine metal masks 10 are arranged side by side in the second direction Y, and are welded to the same mask frame 20 to form a mask assembly. As shown in FIG. 2, four fine metal masks 10 are welded to the same mask frame 20 side by side. The first welding region 121 of the four fine metal masks 10 may be covered by the same long welding sheet 30 to be welded to the first border 21 of the mask frame 20, or a plurality of welding sheets 30 may be used to respectively cover the first welding region 121 of the four fine metal masks 10 for welding. The second welding region 122 of the four fine metal masks 10 may be covered by the same long welding sheet 30 to be welded to the second border 22 of the mask frame 20, or a plurality of welding sheets 30 may be used to respectively cover the second welding region 122 of the four fine metal masks 10 for welding.

Figure 3:
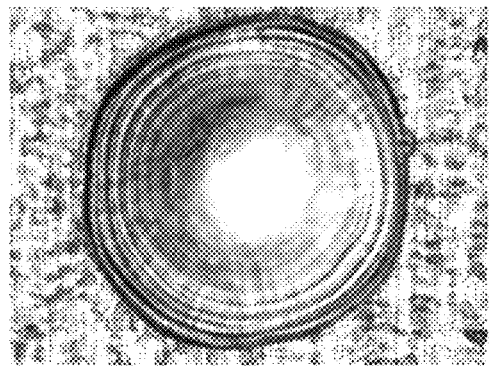
FIG. 3 shows a structural diagram of a welded second through hole of a welding region of a fine metal mask according to some embodiments of the present disclosure.

FIG. 3 shows a structural diagram of a welded second through hole of a welding region of a fine metal mask according to some embodiments of the present disclosure. Since a welding sheet 30 is provided, a welding region 12 of a fine metal mask 10 and a border of a mask frame 20 may be welded more firmly, so as to avoid false welding.

In some embodiments, the material of the mask frame 20 and the material of the welding sheet 30 is the same as the material of the fine metal mask 10, and the material of the mask frame 20 and the material of the welding sheet 30 are made of a metal or metal alloy with a low coefficient of expansion, such as Invar alloy or SUS alloy.

Some embodiments of the present disclosure provide a method for manufacturing of a mask assembly. FIG. 4 shows a flowchart of a method for manufacturing a mask assembly according to some embodiments of the present disclosure. As shown in FIG. 4, the method for manufacturing a mask assembly includes the following steps.

S10, a fine metal mask is stretched in an extending direction (the first direction X) of the fine metal mask by using a tensioning machine, so that the fine metal mask is in a stretched state.

S20, the fine metal mask in the stretched state is aligned and clung with a mask frame, so that a welding region of the fine metal mask is clung to two opposite borders of the mask frame.

S30, the welding region is welded to the two borders.

In some embodiments, in step S10, a tension is applied to the fine metal mask in the extending direction of the fine metal mask by the tensioning machine, so that the fine metal mask is in a substantially flat stretched state, ensuring that first through holes in an effective mask region on the fine metal mask are substantially at predetermined positions in a plane, i.e., predetermined design positions corresponding to pixels of AMOLED.

In step S30, a welding sheet is arranged at the welding region, and the welding sheet is located on a side of the welding region away from the mask frame, and the welding sheet, the welding region and the two borders are welded by, for example, using the laser welding process. Specifically, the welding sheet, the first welding region and the first border are welded together by using the laser welding process, and the welding sheet, the second welding region and the second border are welded together by using the laser welding process.

In some embodiments, the method for manufacturing a mask assembly further includes the following steps.

S40, the fine metal mask is cut at a side of the welding region away from an effective mask region.

In step S40, at least a part of a clamping region and at least a part of a stress buffering region of the fine metal mask are removed, thereby forming a mask assembly for the evaporation process.

Hereinafter, a stretching simulation comparison is performed between the fine metal mask provided in the present disclosure and the fine metal mask in the related art, so as to reflect advantages of the fine metal mask provided in the present disclosure.

Figure 5:
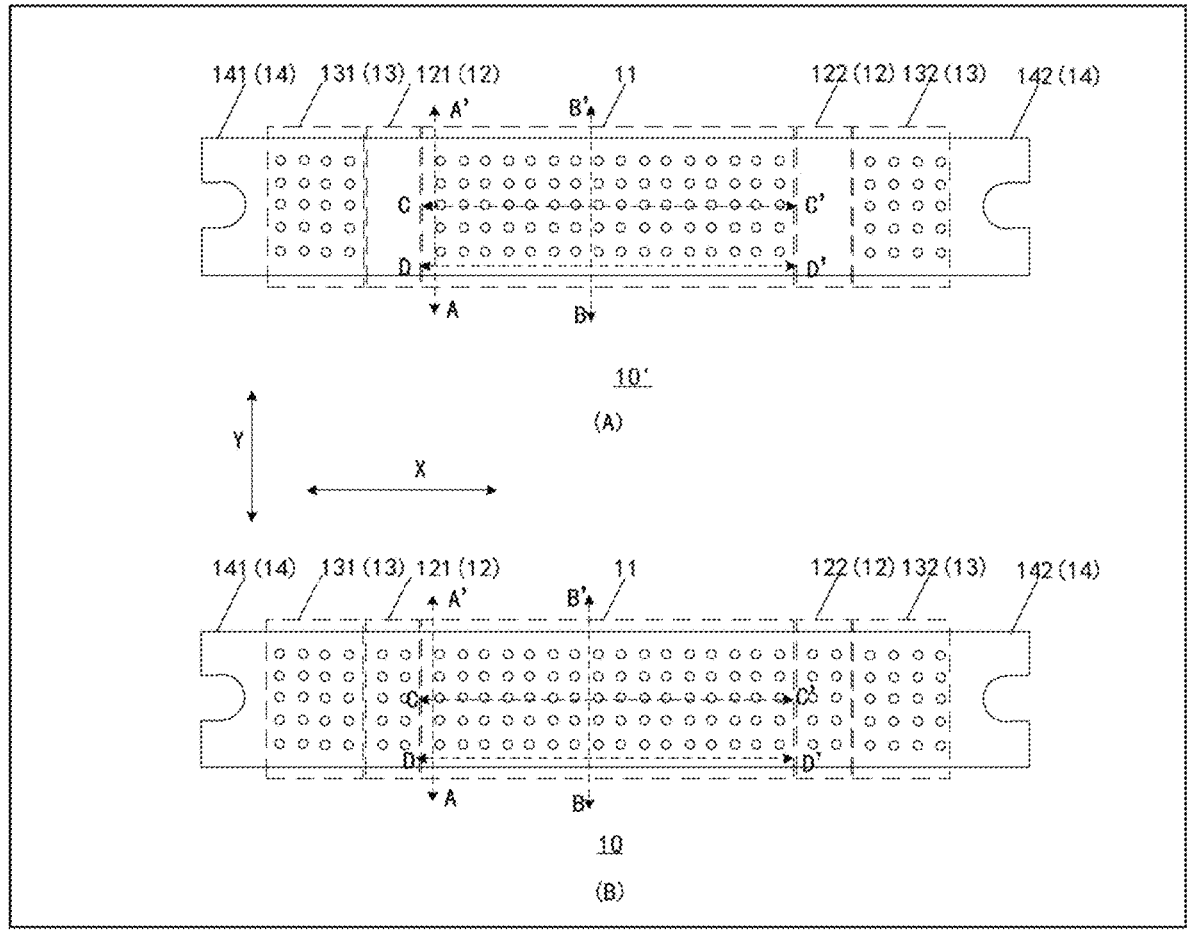
FIG. 5 shows a comparison diagram of a fine metal mask in the related art and a fine metal mask according to some embodiments of the present disclosure.

FIG. 5 shows a comparison diagram of a fine metal mask in the related art and a fine metal mask according to some embodiments of the present disclosure. In FIG. 5, (A) shows a schematic structural diagram of the fine metal mask in the related art; (B) shows a comparison diagram of the fine metal mask according to some embodiments of the present disclosure. A structure of the fine metal mask 10' in (A) is substantially the same as that of the fine metal mask 10 in (B), and both include an effective mask region 11, a welding region 12, a stress buffering region 13 and a clamping region 14 and have the same size and relative positional relationship. A difference between the fine metal mask 10 in (B) and the fine metal mask 10' in (A) is only that through holes are added in the welding region 12 in (B), i.e., second through holes 120, while the welding region 12 of the fine metal mask 10' in (A) is a solid material region, and no through holes are provided.

Figure 6:
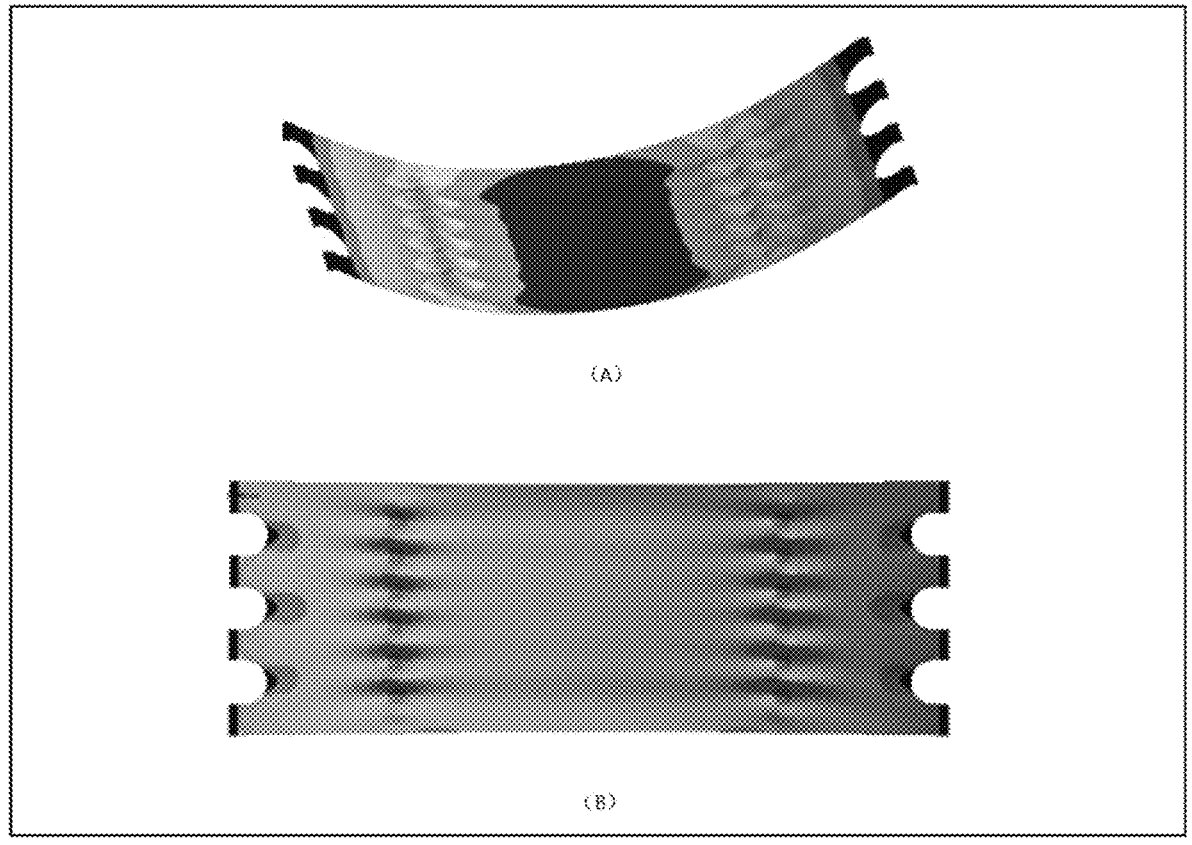
FIG. 6 shows a stretching cloud map of a fine metal mask during a stretching simulation in the related art.
Figure 7:
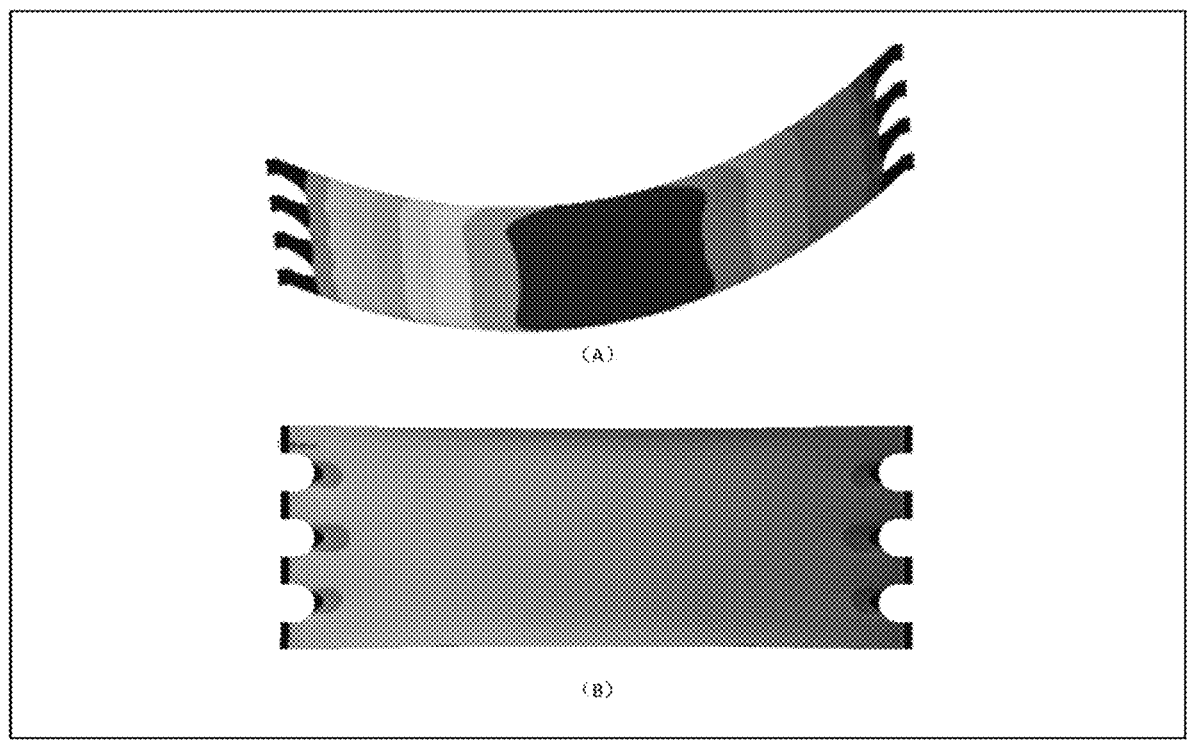
FIG. 7 shows a stretching cloud map of a fine metal mask during a stretching simulation according to some embodiments of the present disclosure.

In some embodiments, a stretching simulation is performed on the fine metal masks in the related art and the fine metal mask according to some embodiments of the present disclosure. FIG. 6 shows a stretching cloud map of a fine metal mask during a stretching simulation in the related art. As shown in FIG. 6, (A) shows a total strain cloud map of the fine metal mask during a stretching simulation in the related art, and (B) shows a stress cloud map of the fine metal mask during a stretching simulation in the related art. FIG. 7 shows a stretching cloud map of a fine metal mask during a stretching simulation according to some embodiments of the present disclosure. As shown in FIG. 7, (A) shows a total strain cloud map of the fine metal mask during a stretching simulation according to some embodiments of the present disclosure, and (B) shows a stress cloud map of the fine metal mask during a stretching simulation according to some embodiments of the present disclosure.

The total strain cloud map and stress cloud map described above are obtained when the fine metal mask is stretched so that first through holes in an effective mask region 11 are substantially at predetermined positions in a plane. By comparing FIG. 6 and FIG. 7, it may be seen that the fine metal mask 10' in the related art generates a plurality of wrinkles in a welding region 12, and extends toward two sides of the welding region 12 in the stretching direction, while the stress of the welding region 12 is concentrated. The stretching of the fine metal mask according to some embodiments of the present disclosure is substantially free of wrinkles, and the stretching stress is uniform.

Figure 8:
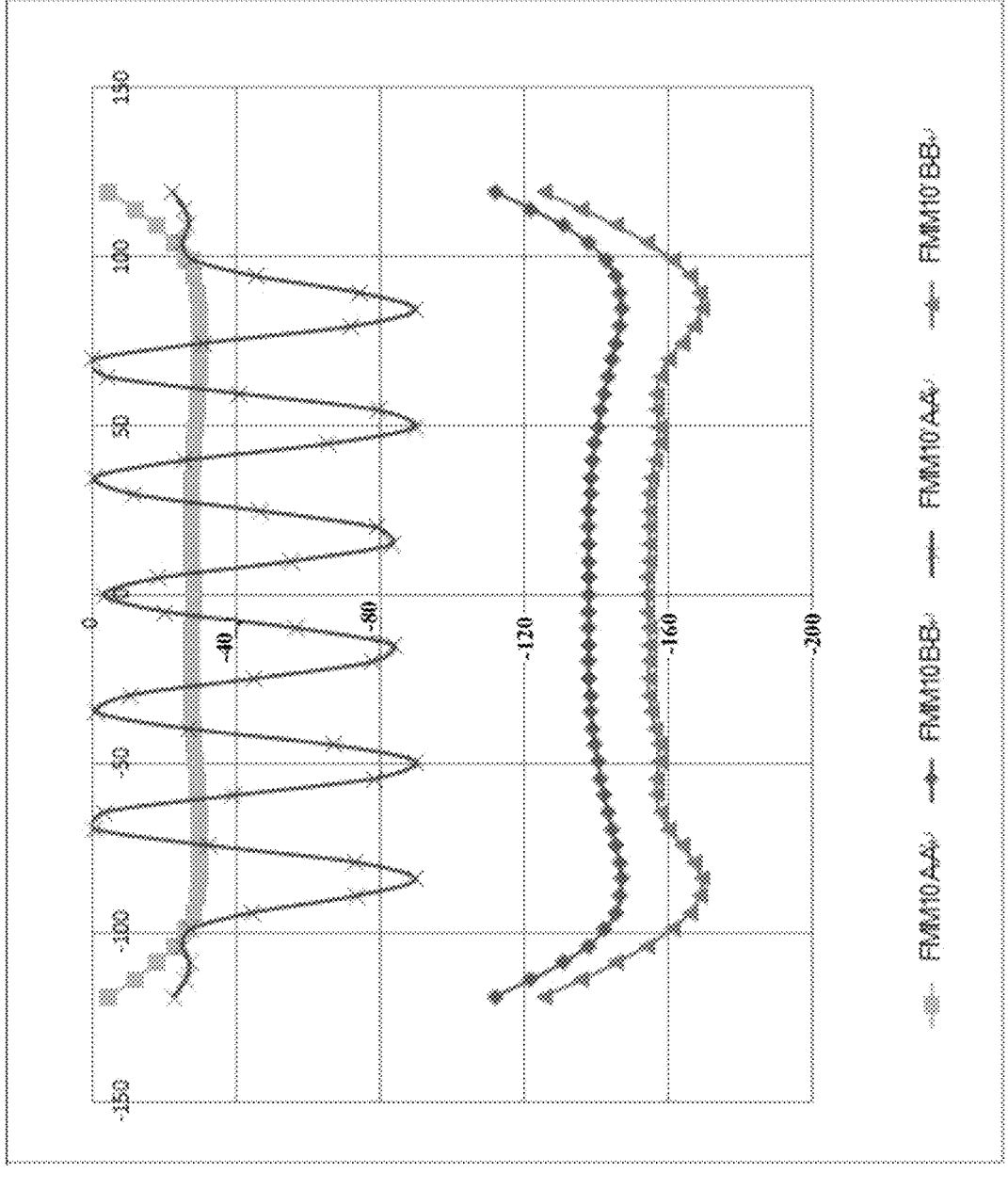
FIG. 8 shows a comparison diagram of a stretching wrinkle of a fine metal mask in the related art and a fine metal mask according to some embodiments of the present disclosure.

FIG. 8 shows a comparison diagram of a stretching wrinkle of a fine metal mask in the related art and a fine metal mask according to some embodiments of the present disclosure. Specifically, FIG. 8 shows deformations of the fine metal mask 10' (labeled as FMM10' in FIG. 8) along a section A-A' and a section B-B' in (A) of FIG. 5 in the related art, and shows deformations of the fine metal mask 10 (labeled as FMM10 in FIG. 8) along a section A-A' and a section B-B' in (B) of FIG. 5 according to some embodiments of the present disclosure. The section A-A' is located in the effective mask region 11 of the fine metal mask 10/10' close to the welding region 12, and the section B-B' is located in the effective mask region 11 in the fine metal mask 10/10' close to a centerline of the effective mask region 11 in the second direction Y.

As shown in FIG. 8, in the effective mask region 11 of the fine metal mask 10' close to the welding region 12 in the related art, the wrinkles are relatively obvious, which will increase a shadow of an actual evaporation, resulting in a higher risk of defects such as color mixing. The stretching wrinkle of the fine metal mask 10 according to some embodiments of the present disclosure is smaller at both the AA' section and the BB' section, which may reduce a evaporation shadow and improve a production yield compared with the fine metal mask 10' in the related art.

Figure 9:
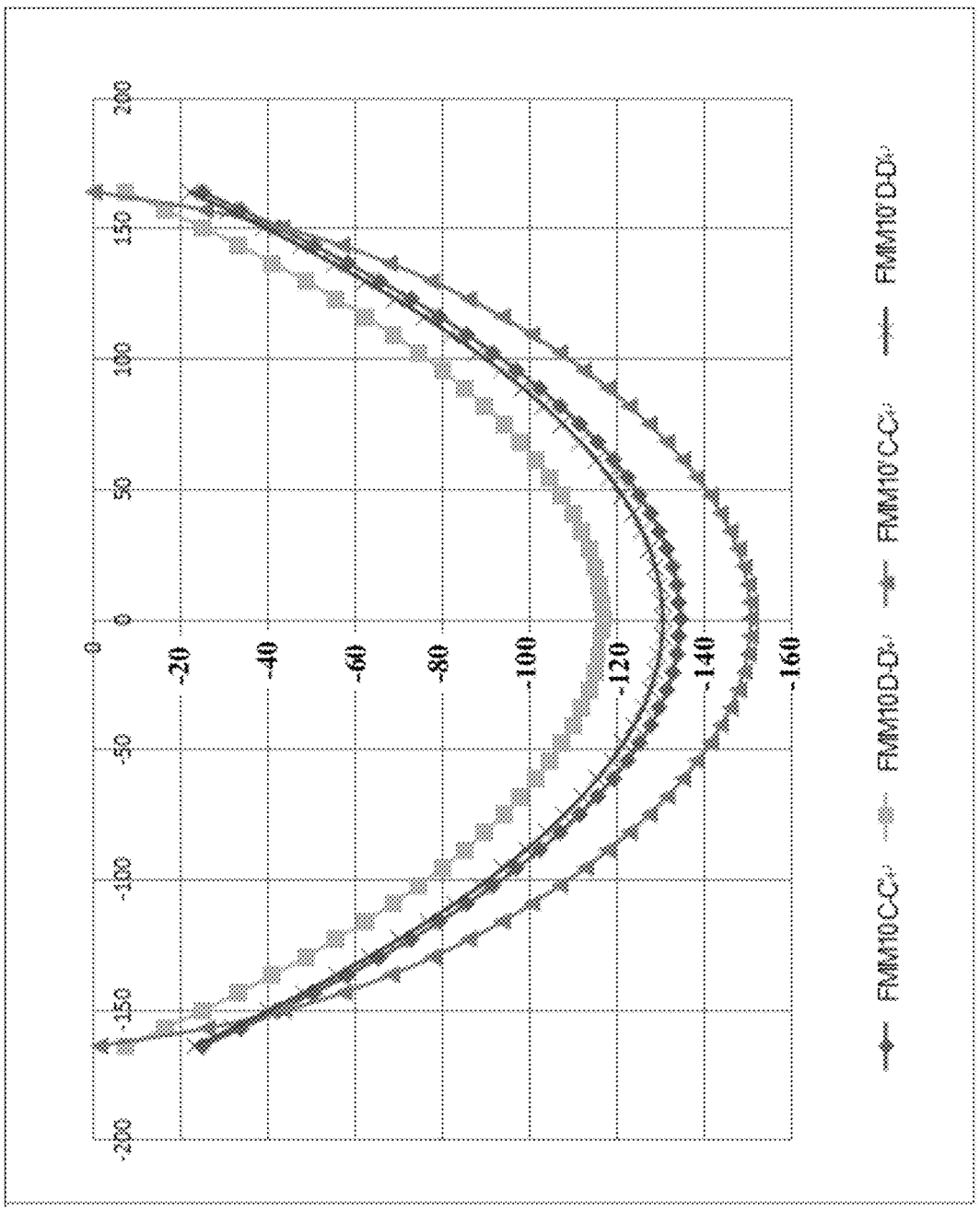
FIG. 9 shows a comparison diagram of stretching sag of a fine metal mask in the related art and a fine metal mask according to some embodiments of the present disclosure.

FIG. 9 shows a comparison diagram of stretching sag of a fine metal mask in the related art and a fine metal mask according to some embodiments of the present disclosure. Specifically, FIG. 9 shows sags of the fine metal mask 10' (labeled as FMM 10' in FIG. 9) along a section C-C' and a section D-D' in (A) of FIG. 5 in the related art, and shows sags of the fine metal mask 10 (labeled as FMM 10 in FIG. 9) along a section C-C' and a section DD' in (B) of FIG. 5 according to some embodiments of the present disclosure. The section C-C' is located at a center of the effective mask region 11 in the fine metal mask 10/10' in the first direction X, and the section D-D' is located at a edge of the effective mask region 11 in the fine metal mask 10/10' away from the centerline of the effective mask region 11 in the first direction X.

As shown in FIG. 9, a sag amplitude of the fine metal mask 10 according to some embodiments of the present disclosure is smaller than that of the fine metal mask 10' in the related art, that is, compared with the fine metal mask 10' in the related art, the fine metal mask 10 according to some embodiments of the present disclosure is more flat during the tensioning, which may reduce the evaporation shadow and improve the production yield.

The above description is merely preferred embodiments of the present disclosure and an illustration of the technical principles employed. Those skilled in the art should understand that the scope of the invention involved in the present disclosure is not limited to the technical solutions formed by the specific combination of the technical features described above, and should also cover other technical solutions formed by any combination of the technical features or their equivalent features without departing from the inventive concept, such as technical solutions formed by replacing the features described above with the technical features with similar functions (but not limited to) disclosed in the present disclosure.

What is claimed is:

1. A mask assembly, comprising:
a mask frame comprising a plurality of borders and an open region surrounded by the plurality of borders;
at least one mask, wherein the at least one mask comprises an effective mask region located in a middle portion of the mask, wherein the effective mask region comprises a plurality of first through holes arranged in an array; and a welding region configured to be welded to a mask frame and located on opposite sides of the effective mask region, wherein the welding region comprises a plurality of second through holes arranged in an array; and
a welding sheet, wherein the welding sheet is located on a side of the welding region away from the mask frame, and the welding sheet is configured to weld the welding region to two opposite borders of the mask frame,
wherein the at least one mask comprises a plurality of masks, and the plurality of masks are sequentially arranged in an extending direction of the two opposite borders,
wherein the welding sheet is in a shape of a long strip, and the welding sheet is welded to welding regions of the plurality of masks and the two opposite borders of the mask frame, and
wherein a material of the mask frame and a material of the welding sheet are the same as a material of the mask, and each of the material of the mask frame, the material of the welding sheet and the material of the at least one mask is a metal or metal alloy with a low coefficient of expansion.

2. The mask assembly according to claim 1, further comprising:
a stress buffering region located on a side of the welding region away from the effective mask region, wherein the stress buffering region comprises a plurality of third through holes arranged in an array, and the stress buffering region is configured to buffer a stress on the at least one mask when the at least one mask is tensioned.

3. The mask assembly according to claim 2, further comprising:
a clamping region configured to be clamped by a clamp of a tensioning machine when the at least one mask is tensioned, and located on a side of the stress buffering region away from the welding region.

4. The mask assembly according to claim 3, wherein,
the welding region comprises a first welding region and a second welding region, and the first welding region and the second welding region are respectively located on opposite sides of the effective mask region;
the stress buffering region comprises a first stress buffering region and a second stress buffering region, the first stress buffering region is located on a side of the first welding region away from the effective mask region, and the second stress buffering region is located on a side of the second welding region away from the effective mask region;

the clamping region comprises a first clamping region and a second clamping region, the first clamping region is located on a side of the first stress buffering region away from the first welding region, and the second clamping region is located on a side of the second stress buffering region away from the second welding region.

5. The mask assembly according to claim 2, wherein a distribution density of the first through holes, a distribution density of the second through holes, and a distribution density of the third through holes are the same or different.

6. The mask assembly according to claim 5, wherein a shape of the first through hole is a circle or a polygon.

7. The mask assembly according to claim 5, wherein a spacing between adjacent first through holes is 10 to 300 μm.

8. The mask assembly according to claim 1, wherein the material of the at least one mask is Invar alloy or SUS alloy.

9. The mask assembly according to claim 1, wherein a shape of the first through hole is a circle or a polygon.

10. The mask assembly according to claim 1, wherein a spacing between adjacent first through holes is 10 to 300 μm.

11. The mask assembly according to claim 1, wherein an orthographic projection of an effective mask region of the at least one mask on the mask frame falls into the open region.

12. The mask assembly according to claim 11, wherein the at least one mask comprises a plurality of masks, and the plurality of masks are sequentially arranged in an extending direction of the two opposite borders.

13. The mask assembly according to claim 1, wherein a material of the at least one mask frame is a metal or metal alloy material with a low coefficient of expansion.

14. A method for manufacturing a mask assembly, comprising:
stretching the mask according to claim 1 in an extending direction of the mask by using a tensioning machine, so that the mask is in a stretched state;
aligning and clinging the mask in the stretched state with a mask frame, so that a welding region of the mask is clung to two opposite borders of the mask frame; and
welding the welding region to the two borders.

15. The method according to claim 14, wherein the welding the welding region to the two borders comprises:
arranging a welding sheet at the welding region, wherein the welding sheet is located on a side of the welding region away from the mask frame, and the welding region is welded to the two borders by using the welding sheet.

16. The method according to claim 15, further comprising:
cutting the mask on a side of the welding region away from an effective mask region.

17. The method according to claim 14, further comprising:
cutting the mask on a side of the welding region away from an effective mask region.

* * * * *